(12) United States Patent
Matsui et al.

(10) Patent No.: US 7,727,891 B2
(45) Date of Patent: Jun. 1, 2010

(54) METHOD OF MANUFACTURING A SEMICONDUCTOR DEVICE USING A WET PROCESS

(75) Inventors: Yoshitaka Matsui, Yokohama (JP); Masako Kodera, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 11/074,774

(22) Filed: Mar. 9, 2005

(65) Prior Publication Data

US 2005/0148176 A1 Jul. 7, 2005

Related U.S. Application Data

(62) Division of application No. 10/384,565, filed on Mar. 11, 2003, now Pat. No. 6,903,015.

(30) Foreign Application Priority Data

Mar. 12, 2002 (JP) ............................. 2002-067501

(51) Int. Cl.
*H01L 21/461* (2006.01)

(52) U.S. Cl. ................. 438/692; 438/687; 438/627; 438/629; 438/643; 438/653; 257/762; 257/751; 257/774; 257/E21.081; 257/E21.576; 257/E21.579; 257/E21.227; 257/E21.583; 257/E21.584; 257/E21.585; 257/E21.586

(58) Field of Classification Search ................. None
See application file for complete search history.

(56) References Cited

U.S. PATENT DOCUMENTS

| | | | |
|---|---|---|---|
| 5,804,505 A * | 9/1998 | Yamada et al. ............... | 438/643 |
| 6,117,775 A * | 9/2000 | Kondo et al. ................. | 438/690 |
| 6,287,968 B1 | 9/2001 | Yu et al. | |
| 6,290,777 B1 * | 9/2001 | Imaoka et al. ................ | 134/1 |
| 6,346,505 B1 * | 2/2002 | Morita et al. ................ | 510/175 |
| 6,348,157 B1 | 2/2002 | Ohmi et al. | |
| 6,551,943 B1 | 4/2003 | Eissa et al. | |
| 6,592,677 B1 | 7/2003 | Tomimori et al. | |
| 6,613,585 B2 * | 9/2003 | Sakurai et al. ................. | 438/3 |
| 6,613,664 B2 * | 9/2003 | Barth et al. ................. | 438/629 |
| 6,645,852 B1 * | 11/2003 | Taguchi et al. .............. | 438/637 |
| 6,723,631 B2 * | 4/2004 | Noguchi et al. ............. | 438/618 |
| 6,727,593 B2 * | 4/2004 | Toyoda et al. ............... | 257/762 |
| 6,943,115 B2 * | 9/2005 | Horiuchi et al. ............. | 438/692 |
| 6,946,036 B2 * | 9/2005 | Tsuga et al. .................. | 134/28 |

FOREIGN PATENT DOCUMENTS

JP          11-29794          2/1999

(Continued)

*Primary Examiner*—Minh-Loan T Tran
*Assistant Examiner*—Fei Fei Yeung Lopez
(74) *Attorney, Agent, or Firm*—Finnegan, Henderson, Farabow, Garrett & Dunner, L.L.P.

(57) ABSTRACT

A method of manufacturing a semiconductor device, including the following processes of forming a structure in which a barrier metal containing at least of Ti and Ta and a copper wiring are exposed on its surface, or a structure in which at least one substance selected from the group consisting of Ti, W, and Cu and Al are exposed on its surface, above a semiconductor substrate, and supplying a hydrogen-dissolved solution dissolving hydrogen gas to the surface of the structure.

20 Claims, 9 Drawing Sheets

FOREIGN PATENT DOCUMENTS

| | | |
|---|---|---|
| JP | 11-307497 | 11/1999 |
| JP | 11-330023 | 11/1999 |
| JP | 2000-277520 A | 6/2000 |
| JP | 2001-25715 | 1/2001 |
| JP | 2001-358111 | 12/2001 |
| JP | 2002-33385 | 1/2002 |

* cited by examiner

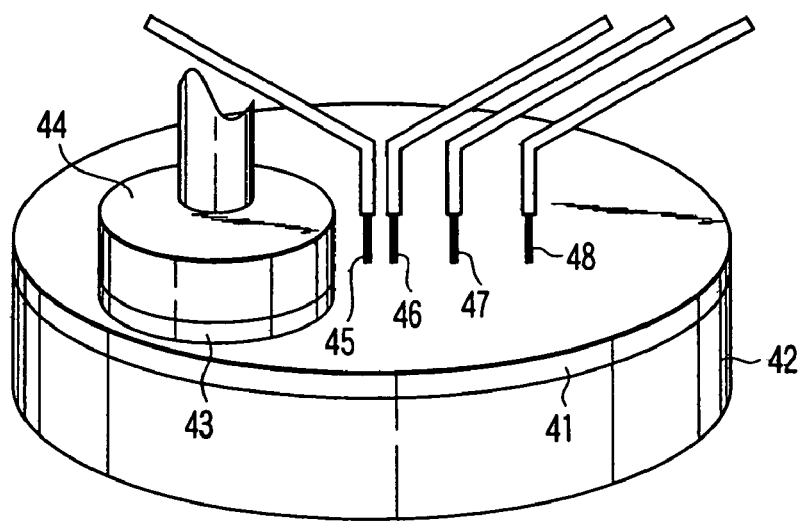
F I G. 8A
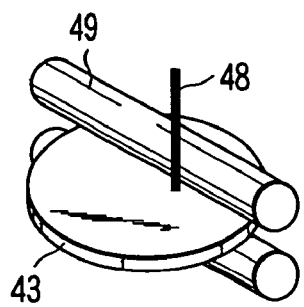
F I G. 8B
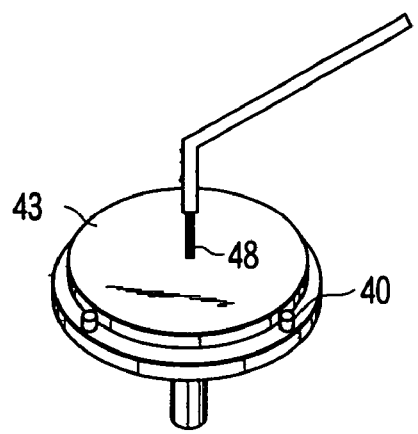
F I G. 8C

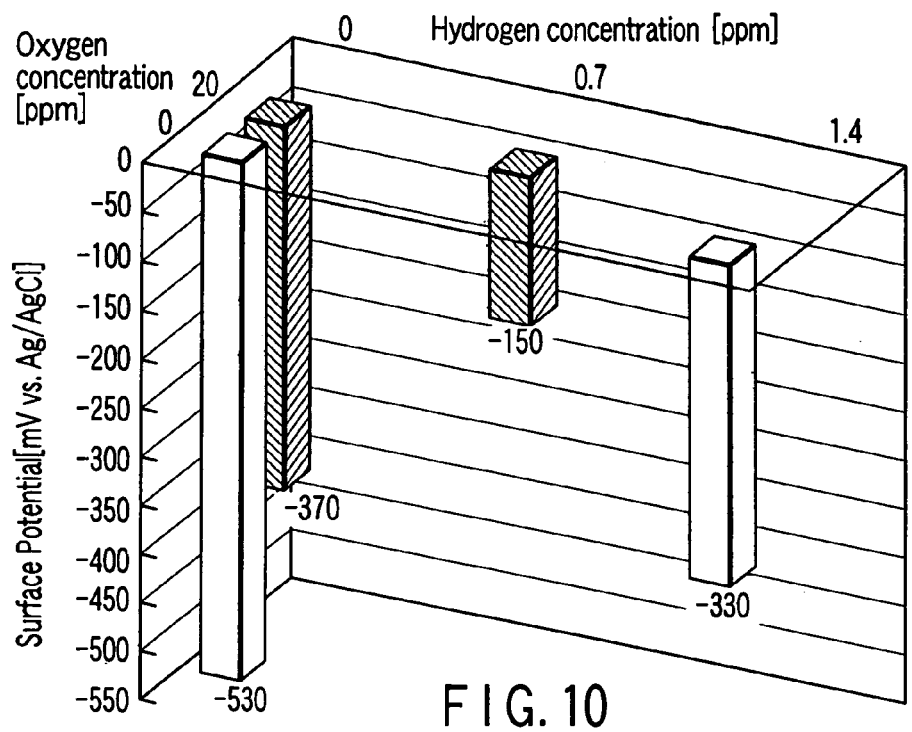
F I G. 10
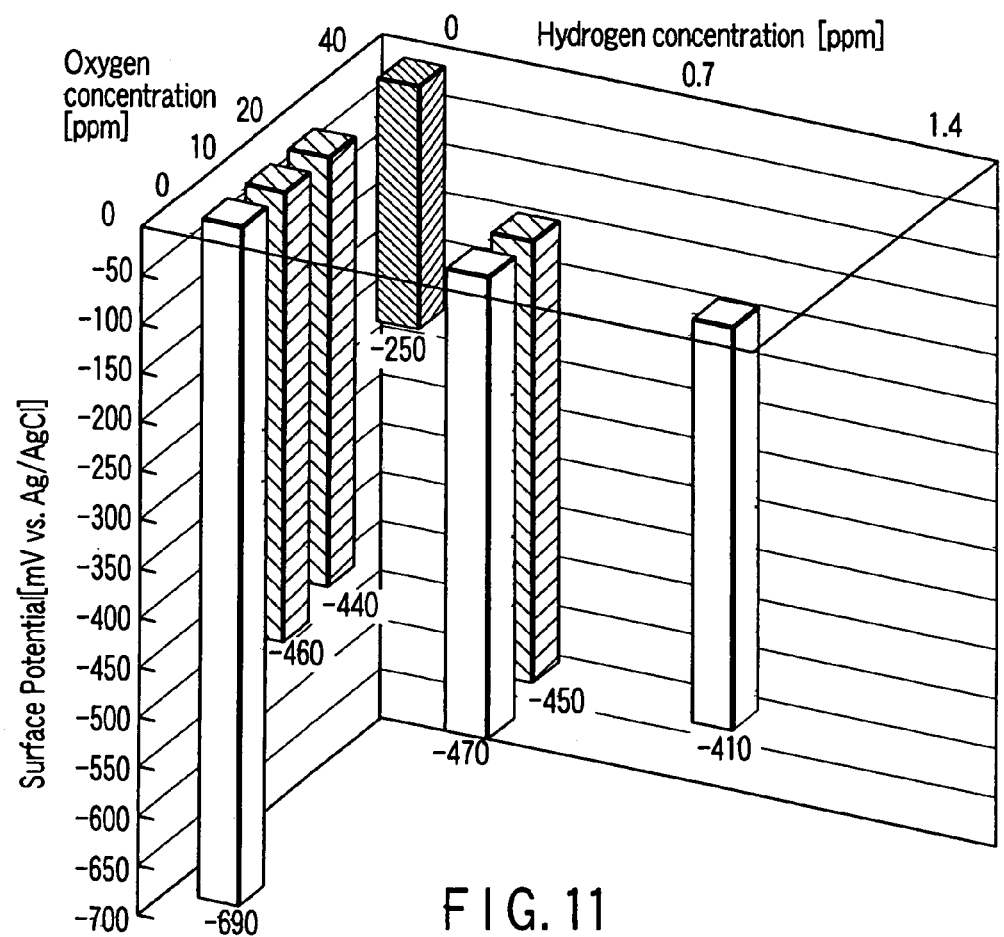
F I G. 11

METHOD OF MANUFACTURING A SEMICONDUCTOR DEVICE USING A WET PROCESS

CROSS-REFERENCE TO RELATED APPLICATIONS

This application is a division of application Ser. No. 10/384,565, filed on Mar. 11, 2003, now U.S. Pat. No. 6,903,015 which claims the benefit of priority from the prior Japanese Patent Application No. 2002-067501, filed Mar. 12, 2002. The entire contents of these related applications are incorporated herein by reference.

BACKGROUND OF THE INVENTION

1. Field of the Invention

The present invention relates to a method of manufacturing a semiconductor device, which carries out a wet process with respect to a semiconductor device whose wiring containing copper or aluminum are exposed.

2. Description of the Related Art

The conventional via hole forming process in the manufacturing process of semiconductor devices will be described below with reference to FIG. 13A to FIG. 13C.

A sample shown in FIG. 13A was prepared. The sample was obtained in the following manner. That is, a Cu wiring 12 was formed in a trench formed in a first interlayer insulating film 10 on a semiconductor substrate (not shown) via barrier metal 11, and a second interlayer insulating film 14 was further formed thereon via a SiC layer 13.

The above second interlayer insulating film 14 and SiC layer 13 were etched by dry etching so that a via hole 15 could be formed. The barrier metal 11 and the Cu wiring 12 were exposed on the bottom surface of the via-hole 15. When the via hole 15 was formed, a Cu reactive layer 16 was formed.

As depicted in FIG. 13B, the Cu reactive layer 16 was removed using a contact hole cleaning liquid 21 such as diluted hydrofluoric acid (DHF). Then, as seen from FIG. 13C, the barrier metal 11 and the Cu wiring 12 were rinsed using pure water 22, and thereafter, dried.

The problems in the conventional technique will be described below with reference to FIG. 14A and FIG. 14B. When the Cu wiring 12 and the barrier metal 11 exposed in forming the via hole come into contact with the solution, a cell circuit is formed. If the potential ($E_{Cu}$) of the Cu wiring 12 is higher than the potential ($E_{BM}$) of the barrier metal 11, corrosion occurs on the interface between the Cu wiring 12 and the barrier metal 11 (see FIG. 14A). If the potential ($E_{Cu}$) of the Cu wiring 12 is lower than the potential ($E_{BM}$) of the barrier metal 11, corrosion occurs on the surface of the Cu wiring 12 and the barrier metal 11 (see FIG. 14B). In addition, depending on the kind of contact solution used, corrosion is further accelerated with respect to Cu in the contact solution by synergistic effect with chemical components having etching properties.

In addition, the same problem also as aluminum wiring occurs.

As described above, there is a problem that corrosion occurs in wirings when carrying out a wet process with respect to a semiconductor device on which Cu or Al wirings and other metal material are exposed.

BRIEF SUMMARY OF THE INVENTION (1) According to one aspect of the present invention, there is provided a method of manufacturing a semiconductor device, comprising:

forming a structure, in which a barrier metal containing at least of titanium and tantalum and a copper wiring are exposed on its surface, above a semiconductor substrate; and supplying a hydrogen-dissolved solution dissolving a hydrogen gas to the surface of the structure.

(2) According to one aspect of the present invention, there is provided a method of manufacturing a semiconductor device, comprising:

forming a copper wiring having barrier metal via a first interlayer insulating film above a semiconductor substrate;

forming a second interlayer insulating film above the copper wiring having the a barrier metal and the first interlayer insulating film;

selectively etching the second interlayer insulating film, and forming a hole so that the copper wiring and the barrier metal can be exposed; and cleaning the hole using a hydrogen-dissolved solution dissolving hydrogen gas.

(3) According to one aspect of the present invention, there is provided a method of manufacturing a semiconductor device, comprising:

forming a copper wiring material on an interlayer insulating film formed above a semiconductor substrate and having an wiring trench on its surface via a barrier metal; and carrying out chemical mechanical polishing with respect to the copper wiring material and the barrier metal so as to form a structure in which the copper wiring is buried in the wiring trench via the barrier metal and the copper wiring material and the barrier metal are exposed on its surface, wherein a hydrogen-dissolved solution dissolving hydrogen gas is supplied to the structure in which the copper wiring material and the barrier metal are exposed on the surface.

(4) According to one aspect of the present invention, there is provided a method of manufacturing a semiconductor device, comprising:

forming an wiring structure in which at least one substance selected from the group consisting of titanium, tungsten and copper and aluminium are exposed on it surface, above a semiconductor substrate; and supplying a hydrogen-dissolved solution dissolving hydrogen gas to the surface of the wiring structure.

BRIEF DESCRIPTION OF THE SEVERAL VIEWS OF THE DRAWING

FIG. 8A to FIG. 8C are views schematically showing part of the process of manufacturing the semiconductor device according to the second embodiment of the present invention;

FIG. 10 is a diagram showing a potential difference between Al and Cu obtained from the measurement results of surface potential of Al and Cu in solutions;

FIG. 11 is a diagram showing a potential difference between Al and Ti obtained from the measurement results of surface potential of Al and Ti in solutions;

DETAILED DESCRIPTION OF THE INVENTION

Embodiments of the present invention will be described below with reference to the accompanying drawings.

First Embodiment

The method of manufacturing a semiconductor device according to a first embodiment of the present invention will be described with reference to FIG. 1.

FIG. 1A to FIG. 1E are cross-sectional views showing the process of manufacturing a semiconductor device according to a first embodiment of the present invention.

Figure 1A:
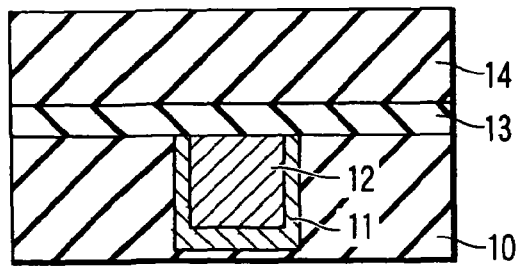
FIG. 1A to FIG. 1E are cross-sectional views showing the process of manufacturing a semiconductor device according to a first embodiment of the present invention.

A semiconductor device shown in FIG. 1A was prepared. A first interlayer insulating film 10 was formed on a semiconductor substrate (not shown). A TaN barrier metal 11 was formed so as to cover the surface of an wiring trench formed in the first interlayer insulating film 10. A Cu wiring 12 was formed in the wiring trench covered with the barrier metal 11. A SiC layer 13 was formed on the first interlayer insulating film 10. A second interlayer insulating film 14 was formed on the SiC layer 13.

Figure 1B:
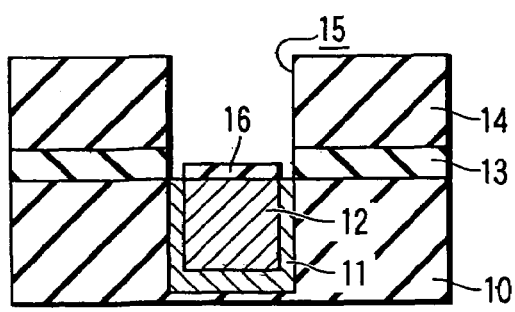

As depicted in FIG. 1B, a resist pattern (not shown) was formed on the second interlayer insulating film 14, thereafter, the second interlayer insulating film 14 above the Cu wiring (copper wiring) 12 was removed using normal dry etching. After the resist pattern was removed, in a state of using the second interlayer insulating film 14 as mask, the SiC layer 13 was dry-etched selectively using $CF_4$, $O_2$ and Ar gases so that a via hole 15 could be formed. The Cu wiring 12 and the barrier metal 11 were exposed on the bottom surface of the via hole 15. When the SiC layer 13 was etched, the Cu wiring 12 reacted with etching gas to form a Cu reactive layer 16 on the surface of the Cu wiring 12.

Figure 1C:
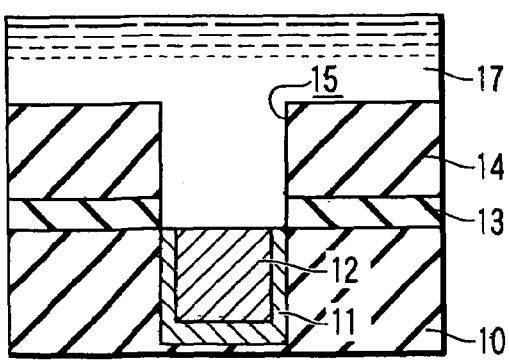
Figure 1D:
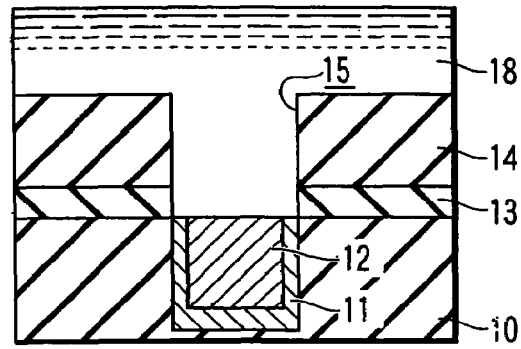
Figure 1E:
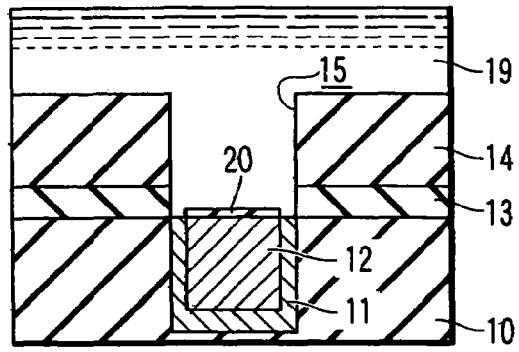

As seen from FIG. 1C, the above Cu reactive layer 16 was removed using-cleaning liquid (hydrogen-dissolved solution) 17 dissolving hydrogen gas in contact (via) hole cleaning liquid such as diluted hydrofluoric acid (DHF). As shown in FIG. 1D, the above cleaning liquid was rinsed using hydrogen-dissolved water (hydrogen-dissolved solution) 18 dissolving a hydrogen gas in ultra-pure water. As illustrated in FIG. 1E, hydrogen-oxygen-dissolved solution 19 dissolving hydrogen and oxygen gases in ultra-pure water was supplied, and the surface of the Cu wiring 12 was oxidized so that an oxide layer 20 could be formed, thereafter, drying was carried out.

The following are descriptions on the effect of the cleaning liquid dissolving hydrogen gas and the rinse liquid and the effect of the hydrogen-oxygen dissolved solution dissolving hydrogen and/or oxygen gases.

Figure 2:
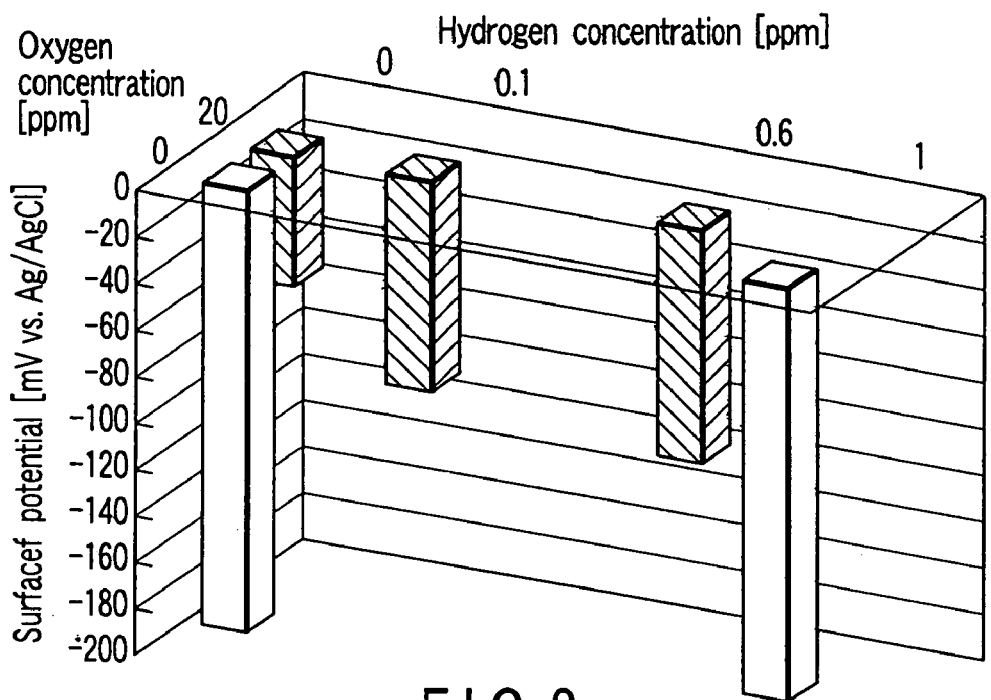
FIG. 2 is a characteristic diagram showing the measurement results of surface potential of Cu in solution.
Figure 3:
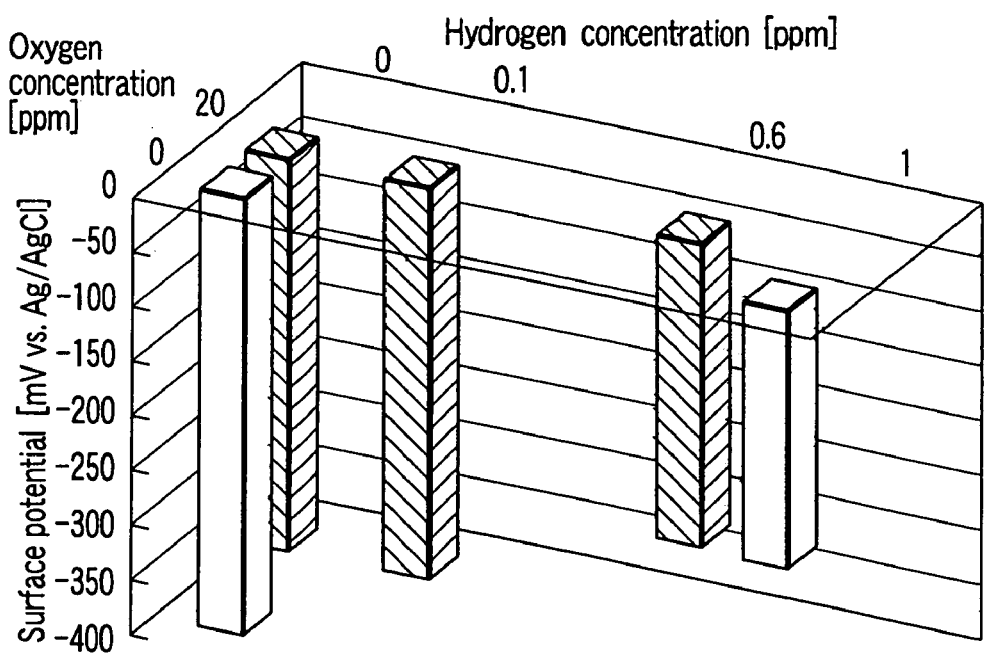
FIG. 3 is a characteristic diagram showing the measurement results of surface potential of Ta in solution.
Figure 4:
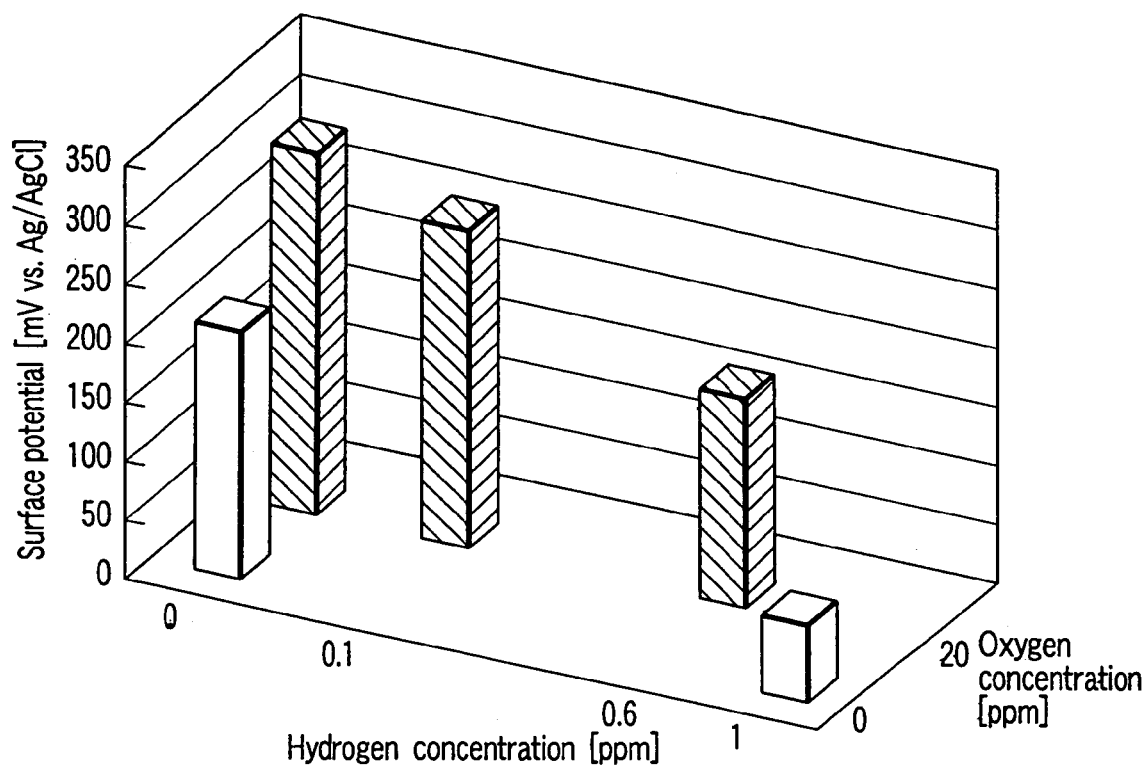
FIG. 4 is a diagram showing a potential difference between Cu and Ta obtained from the measurement results of surface potential of Cu and Ta in solutions.

FIG. 2 to FIG. 4 show the results when measuring each natural potential of Cu and tantalum (Ta) in ultra-pure water dissolving hydrogen and oxygen gases. More specifically, the natural potential was measured under the condition that the hydrogen concentration in a solution having an oxygen concentration of 0 to 20 ppm was changed. In this case, the solution having an oxygen concentration of 0 ppm is equivalent to cleaning and rinsing liquid, and the solution having an oxygen concentration of 20 ppm is equivalent to solution used for oxidation.

FIG. 2 is a characteristic diagram showing the measurement results of natural potential of Cu in solution. FIG. 3 is a characteristic diagram showing the measurement results of surface potential of Ta in solution. FIG. 4 is a diagram showing the potential difference between Cu and Ta obtained from the measurement results of natural potential of Cu and Ta in solutions.

As seen from FIG. 4, the potential difference between Cu and Ta decreased with the increase of the hydrogen concentration in the solution having an oxygen concentration of 0 ppm. The hydrogen gas was dissolved in the cleaning liquid and the rinsing liquid, and thereby, the potential difference between Cu and Ta was suppressed with respect to the fall of solid-liquid interface resistance by chemical components of the cleaning liquid. Therefore, corrosion can be prevented.

Likewise, the potential difference between Cu and Ta decreased with the increase of the hydrogen concentration in the solution having an oxygen concentration of 20 ppm. Therefore, the wiring surface was oxidized using hydrogen-oxygen-dissolved water dissolving hydrogen and oxygen gases, and thereby, the potential difference between Cu and Ta decreases. Consequently, corrosion of wirings can be prevented.

If the Cu wiring was oxidized using oxygen water containing no oxygen gas, a large potential difference existed between the region where the Cu wiring contacts with the barrier metal and the central portion of the Cu wiring. For this reason, a large potential distribution was formed on the surface of the Cu wiring. As a result, the oxidation speed of the Cu wiring interface had a large distribution, and thus, the oxide film was not uniformly formed in its thickness.

However, when the oxygen-hydrogen-dissolved water was supplied, the potential difference between the Cu wiring and the barrier metal became small, and the potential distribution of the surface of the Cu wiring was made average. As a result, the Cu oxidation speed became uniform in the interface; therefore, the interface thickness distribution of the oxide film became substantially uniform.

As shown in FIG. 4, the potential difference between Cu and Ta in the solution having hydrogen concentration of 0.1 ppm or more decreased as compared with the solution having hydrogen concentration of 0 ppm. Therefore, it is preferable that each hydrogen concentration of the cleaning liquid, the rinsing liquid and the hydrogen-oxygen-dissolved solution is set to 0.1 ppm or more. The higher the hydrogen concentration of the solution is, the smaller the potential difference between Cu and Ta becomes. Therefore, it is preferable that the hydrogen concentration of the solution is higher. In this case, the limiting concentration of hydrogen gas with respect to pure water is 2 ppm at room temperature, 101325 Pa (atmospheric pressure).

Figure 5:
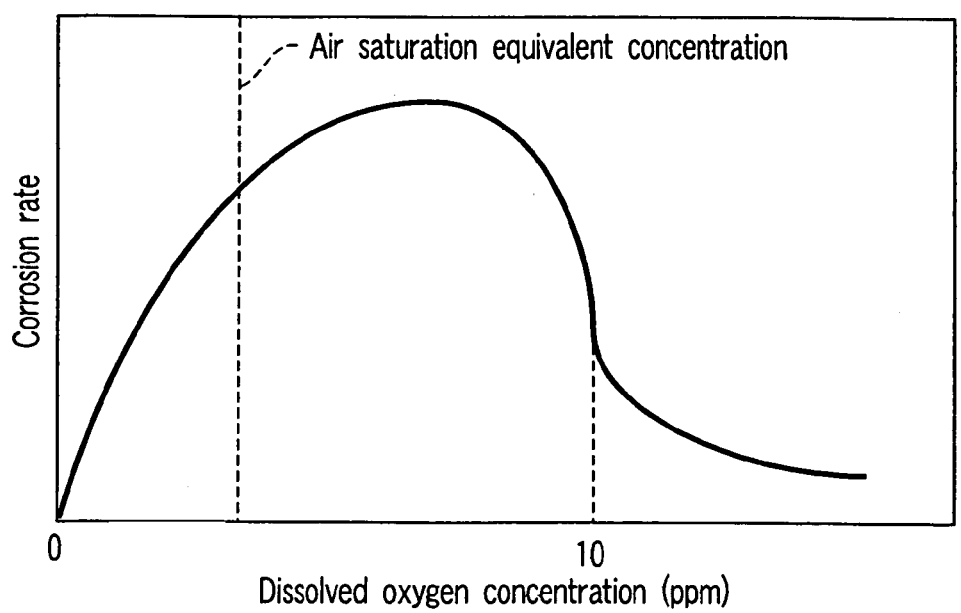
FIG. 5 is a characteristic diagram showing the relationship between oxygen concentration in solution and corrosion rate of Cu.

FIG. 5 shows the relationship between oxygen concentration of solution and corrosion rate of Cu. If the oxygen concentration exceeds a predetermined value, the corrosion rate of Cu is reduced. This is because the Cu surface is oxidized by oxygen, and thereby, a non-active element is formed. As seen from FIG. 5, if the oxygen concentration of the solution is 10 ppm or more, the corrosion rate with respect to Cu becomes low. Therefore, when oxidizing the surface of the Cu wiring using the solution dissolving oxygen and hydrogen gases, it is preferable that the oxygen concentration of the solution is set to 10 ppm or more. Thus, the oxygen concentration of the solution is higher, and thereby, a higher oxidizing effect by the solution is obtained, so that the corrosion rate can be reduced. Consequently, it is preferable that the oxygen concentration is higher. In this case, the limiting concentration of oxygen gas with respect to pure water is 40 ppm at room temperature, 101325 Pa (atmospheric pressure).

However, if there exists a component etching the oxide film (non-active element), the above principle is not established. Before carrying out the process of forming the non-active element using the oxygen-dissolved water, it is desirable to carry out rinsing by hydrogen water so that the component etching the oxide film can be removed. The above component etching the oxide film includes a halogen-based compound, phosphoric acid, sulfuric acid, etc.

The present invention is not limited to the above first embodiment. For instance, in the above embodiment, TaN is used as the barrier metal for suppressing the diffusion of the wiring materials; in this case, a barrier metal containing Ta other than TaN or containing titanium (Ti) may be used.

More specifically, each natural potential of Cu and TiSiN in ultra-pure water or a hydrogen-dissolved solution dissolving hydrogen gas in ultra-pure water was measured. The potential difference between of Cu and TiSiN in ultra-pure water was 150 mV.

The potential difference of the Cu and TiSiN in a solution (hydrogen concentration: 1.2 ppm) dissolving hydrogen gas in ultra-water was 100 mV. As described above, it was found that the potential difference between Cu and Ti decreased in the solution dissolving hydrogen. Likewise, it was found that the potential difference between Cu and Ti decreased in a hydrogen-oxygen-dissolved solution dissolving hydrogen and oxygen gases in ultra-water.

Therefore, the solution dissolving hydrogen (and oxygen) gases is supplied to barrier metals containing Ti such as TiSiN, TiN, and thereby, corrosion can be suppressed.

Second Embodiment

Figure 6A:
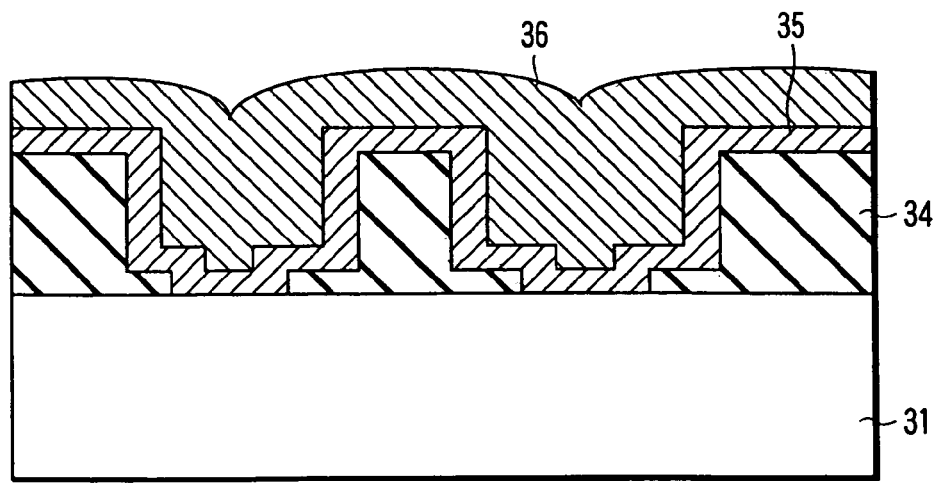
FIG. 6A and FIG. 6B are cross-sectional views showing the process of manufacturing a semiconductor device according to a second embodiment of the present invention.
Figure 6B:
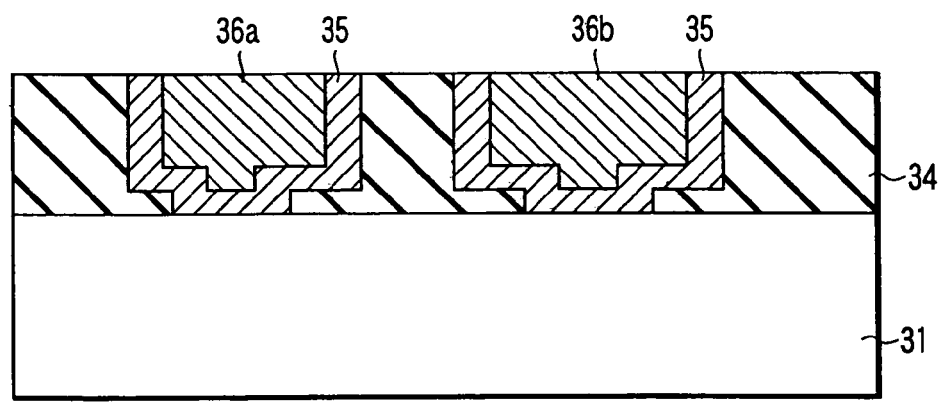

The second embodiment relates to the process of carrying out chemical mechanical polishing with respect to a semiconductor device having the structure shown in FIG. 6A so that a damascene wiring shown in FIG. 6B can be formed.

FIG. 6A and FIG. 6B are cross-sectional view showing the process of manufacturing a semiconductor device according to a second embodiment of the present invention.

The structure of the semiconductor device shown in FIG. 6A will be described below. As shown in FIG. 6A, an interlayer insulating film 34 is formed on a Si substrate 31. A Cu wiring (copper wiring) 36 is formed on the interlayer insulating film 34 via a barrier metal 35 so that that it can be filled in wiring trenches formed on the surface of the above insulating film.

Figure 7:
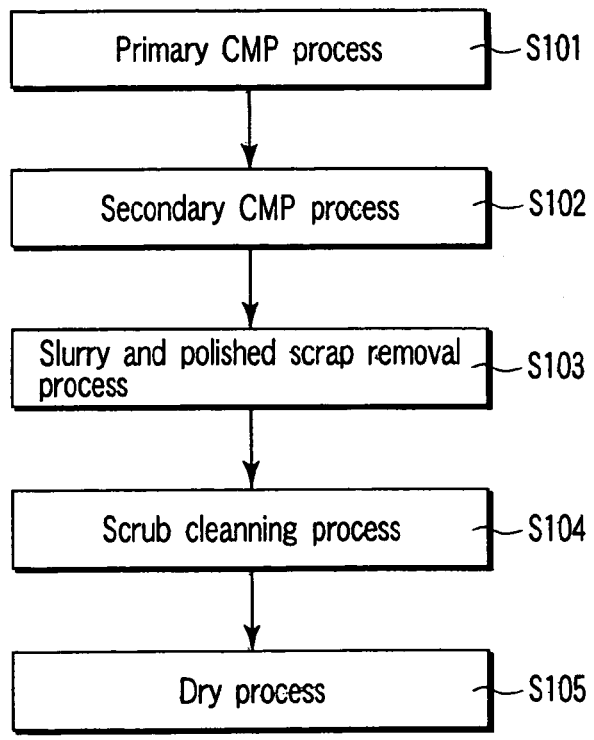
FIG. 7 is a flowchart to explain the process of manufacturing the semiconductor device according to the second embodiment of the present invention.

The process of manufacturing a semiconductor device according to the second embodiment will be described below with reference to FIG. 7 and FIG. 8A to FIG. 8C. FIG. 7 is a flowchart to explain the process of manufacturing the semiconductor device according to the second embodiment of the present invention.

FIG. 8A to FIG. 8C are views schematically showing part of the process of manufacturing the semiconductor device according to the second embodiment of the present invention.

(Step S101: Primary CMP Process)

As illustrated in FIG. 8A, wafer 43 of the semiconductor device shown in FIG. 6A, which is in device manufacturing, is held on a wafer carrier 44 of CMP equipment. Thereafter, the wafer 43 is pressed against a polishing pad 41 stretched across the upper surface of a turntable 42 in a state that the device surface (surface forming the Cu wiring 36) is downwardly directed. The turntable 42 and the wafer carrier 44 are rotated while supplying slurry 45 from a nozzle onto the polishing pad 41, thereafter, chemical mechanical polishing is carried out with respect to the Cu wiring 36. The supply of the slurry 45 is stopped after the barrier metal 35 on the interlayer insulating film 34 is exposed.

In this case, the Cu wiring and the barrier metal are exposed. Thus, cells are formed between the Cu wiring and the barrier metal by the slurry remaining on the device surface; as a result, corrosion occurs. For this reason, slurry dissolving hydrogen gas is used in the primary CMP process.

In the following processes, the Cu wiring and the barrier metal are in a state of being exposed. Thus, hydrogen-dissolved liquid is used as the solution supplied to the device surface so that the occurrence of corrosion can be prevented.

(Step S102: Secondary CMP Process)

In a state that the device surface is pressed against the polishing pad 41, the following CMP process is carried out with respect to the barrier metal 35. That is, the turntable 42 and the wafer carrier 44 are rotated while supplying hydrogen-dissolved slurry 46 (hydrogen-dissolved solution) dissolving hydrogen gas in slurry different from the above primary CPM process (step S101). The barrier metal 35 is removed, and the interlayer insulating film 34 is exposed, thereafter, the supply of the hydrogen-dissolved slurry 46 is stopped. FIG. 6B shows the semiconductor device processed to the above mentioned state. As seen from FIG. 6B, Cu wirings 36a and 36b are filled and formed in the wiring trench via the barrier metal 35.

(Step S103: Slurry and Polished Scrap Removal Process)

The slurry and polished scraps adhering onto the device surface are removed, and thereafter, the wafer 43 is cleaned. Here, in a state that the device surface is pressed against the polishing pad 41, the device surface of the wafer is cleaned in the following manner. That is, the turntable 42 and the wafer carrier 44 are rotated while supplying chemical liquid 47 and hydrogen-dissolved water (hydrogen-dissolved solution) 48 dissolving hydrogen gas in pure water.

In the above process, the chemical liquid 47 and the hydrogen-dissolved water 48 are used. In this case, hydrogen-dissolved liquid dissolving hydrogen gas in the chemical liquid 47 and pure water may be supplied to the device surface. In addition, hydrogen-dissolved water and pure water may be supplied to the device surface.

(Step S104: Scrub Cleaning Process)

As illustrated in FIG. 8B, scrub cleaning is carried out with respect to the wafer 43 by a roll brush 49 capable of cleaning both surfaces of the wafer while supplying cleaning liquid. In this case, the roll brush 49 is rotating, while the wafer 43 is rotated by a drive mechanism (not shown). Usually, pure water or cleaning chemical liquid diluted with pure water is used as the cleaning liquid. In the second embodiment, cleaning liquid dissolving hydrogen gas in pure water or cleaning chemical liquid diluted with pure water is used.

In FIG. 8B, the wafer 43 and the roll brush 49 are horizontally positioned; in this case, they may be vertically positioned. The cleaning step is not limited to one step, and two steps or more may be taken. The brush is not limited to a roll type. In place of scrub members such as a brush, even if non-contact cleaning such as megasonic cleaning is employed, hydrogen-dissolved water is used in place of pure water, and thereby, corrosion can be prevented.

(Step S105: Dry Process)

Finally, a dry process is carried out with respect to the wafer 43. As seen from FIG. 8C, in a state that a wafer chuck 40 holds the wafer 43, the wafer 43 is rotated at high speed, and thereby, a dry process is carried out. Before the dry process, a rinse process may be carried out with respect to the wafer 43. In this case, the hydrogen-dissolved water 48 dissolving hydrogen gas in a pure water is used in place of pure water used for the usual rinse process, and thereby, corrosion can be effectively prevented.

The present invention is not limited to the above embodiment. In the working stage, various modifications may be made without departing from the scope of the invention. For example, the present invention is not limited to the structure in which the barrier metal is formed so as to cover the surroundings of the wiring. The solution dissolving hydrogen (and oxygen) gas may be supplied to the structure in which the wiring and the barrier metal are exposed on the surface of the semiconductor device.

The solution dissolving hydrogen gas or the solution dissolving hydrogen and oxygen gases is used for the pre-treatment of non-electrolytic plating when carrying out non-electrolytic plating with respect to the following semiconductor device, which is in device manufacturing. The semiconductor device has the structure in which a copper oxide film and a barrier metal containing Ti or Ta are exposed on the surface. Various copper oxides are formed on the surface of the Cu wiring. Before non-electrolytic plating, various copper oxides are temporarily removed; thereafter, the pre-treatment for forming one kind of copper oxide on the surface of the Cu wiring is carried out. When carrying out the pre-treatment of non-electrolytic plating, hydrogen gas is dissolved in etching solution removing copper oxides, and thereby, corrosion of the Cu wiring can be suppressed. In addition, when forming oxide films on the surface of the Cu wiring, the solution dissolving hydrogen and oxygen gases is supplied, and thereby, corrosion of the Cu wiring can be suppressed.

Third Embodiment

The method of manufacturing a semiconductor device according to a third embodiment of the present invention will be described below with reference to FIG. 9A to FIG. 9G. FIG. 9A to FIG. 9G are cross-sectional views showing the process of manufacturing a semiconductor device according to the third embodiment of the present invention.

Figure 9A:
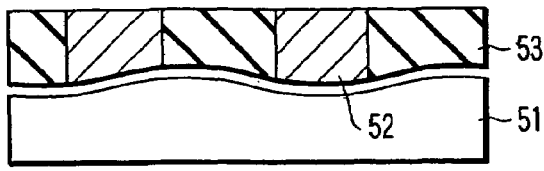
FIG. 9A to FIG. 9G are cross-sectional views showing the process of manufacturing a semiconductor device according to a third embodiment of the present invention.

A semiconductor device depicted in FIG. 9A was prepared. As seen from FIG. 9A, an interlayer insulating film 53 was formed on a semiconductor substrate 51. A W plug 52 was buried in a hole formed in the interlayer insulating film 53.

Figure 9B:
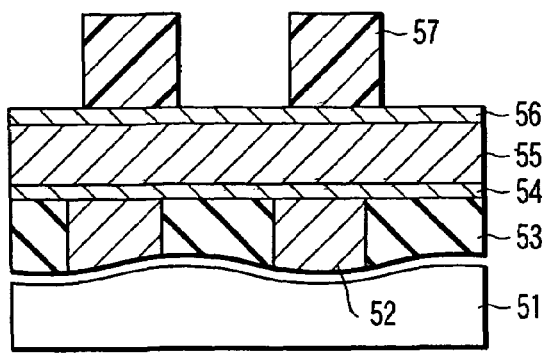

As shown in FIG. 9B, a first TiN film 54 as a lower layer barrier metal, Al—Cu wiring 55, and second TiN film 56 as an upper layer barrier metal were successively formed on the above W plug 52 and interlayer insulating film 53. Thereafter, a resist pattern 57 was formed on the second TiN film 56.

Figure 9C:
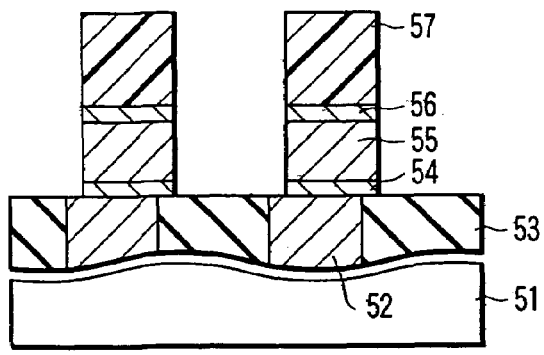
Figure 9D:
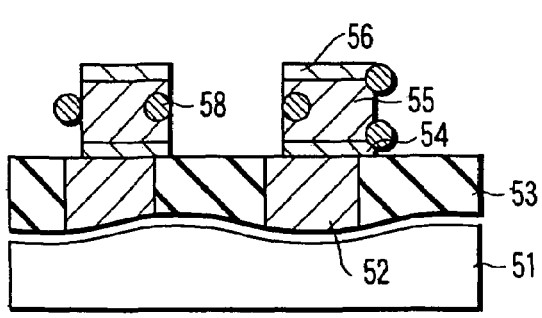

As depicted in FIG. 9C, the above second TiN film 56, Al—Cu wiring 55, and first TiN film were successively etched by the RIE process. As shown in FIG. 9D, the resist pattern 57 was removed by an asher. In this case, Cu 58 slightly contained in the Al—Cu wiring 55 may be segregated on the surface of the wiring 55.

Figure 9E:
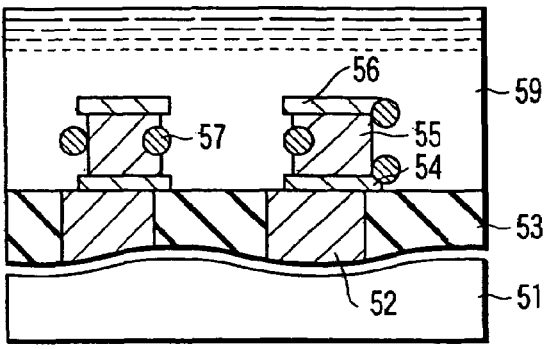
Figure 9F:
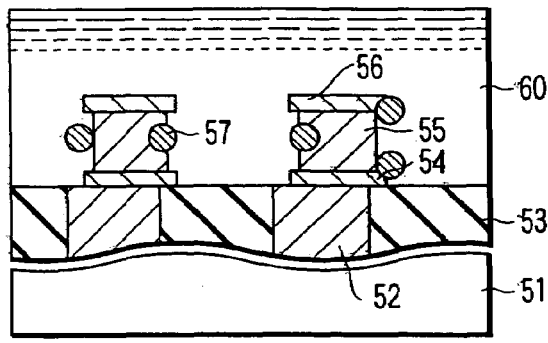

As shown in FIG. 9E, etching solution 59 was supplied in order to remove resist residues. Thereafter, as illustrated in FIG. 9F, cathode water 60 was supplied to the surface of the wiring structure as solution dissolving hydrogen so that rinsing could be carried out. In this case, the above cathode water was liquid obtained on the cathode side when electrolyzing water. When electrolyzing water, the following chemical reaction took place on the cathode side.

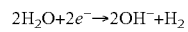

The cathode water contains hydrogen gas. In the embodiment, degassed pure water is electrolyzed so that cathode water can be generated.

Figure 9G:
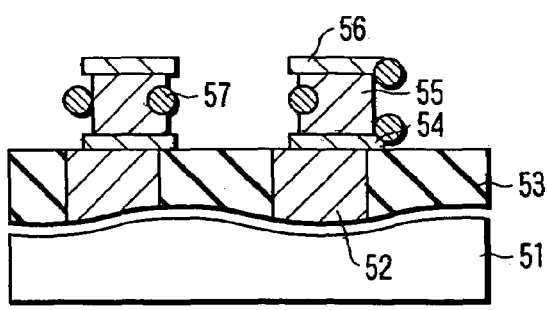

Then, as seen from FIG. 9G, the cathode water 60 was removed, and thereafter, dried.

Conventionally, in the rinse process, pure water has been used. The above Al—Cu wiring 55 exposed in forming the via, Cu 58, TiN films 54, 56 and W plug 52 contact with the pure water, and thereby, a cell circuit is formed. If the potential of the Al—Cu wiring 55 is lower than that of the deposited Cu 58, W plug 52, TiN films 54 and 56, corrosion occurs in the Al—Cu wiring 55.

However, in the third embodiment, rinsing is carried out using the above cathode water 60. The cathode water is used, and thereby, this serves to make small the potential difference between the Al—Cu wiring 55 and Cu 58, TiN films 54, 56 and W plug 52.

Figure 12:
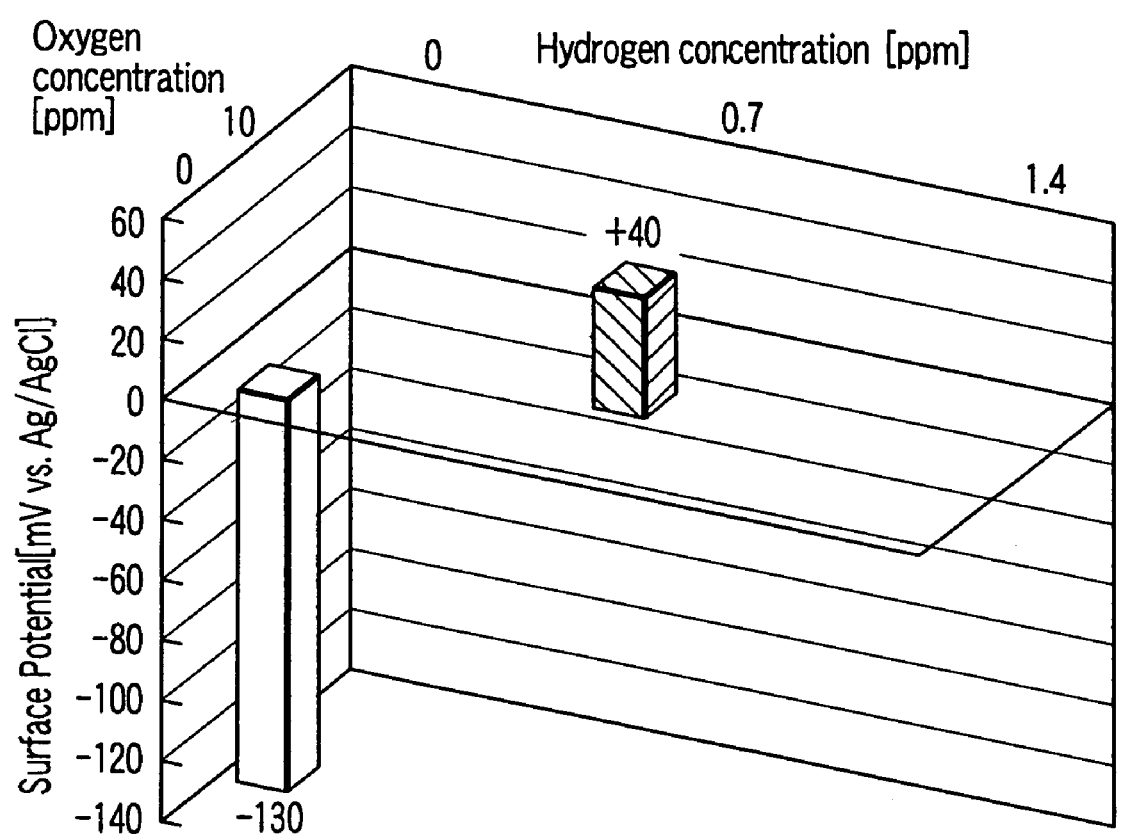
FIG. 12 is a diagram showing a potential difference between Al and W obtained from the measurement results of surface potential of Al and W in solutions.
Figure 13A:
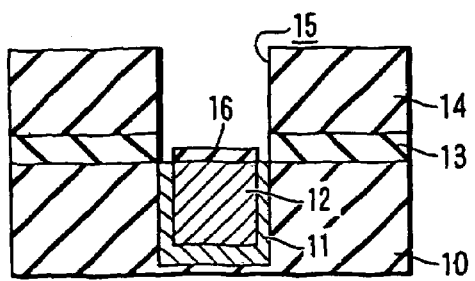
FIG. 13A to FIG. 13C are cross-sectional views showing a conventional process of manufacturing a semiconductor device.
Figure 14A:
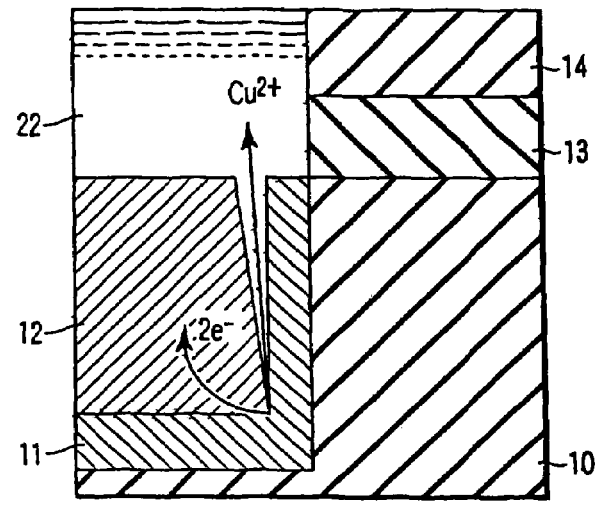
FIG. 14A and FIG. 14B are views to explain the problems of a wet process in the conventional process of manufacturing a semiconductor device.
Figure 13B:
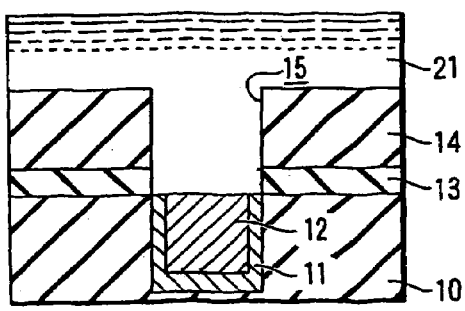
Figure 14B:
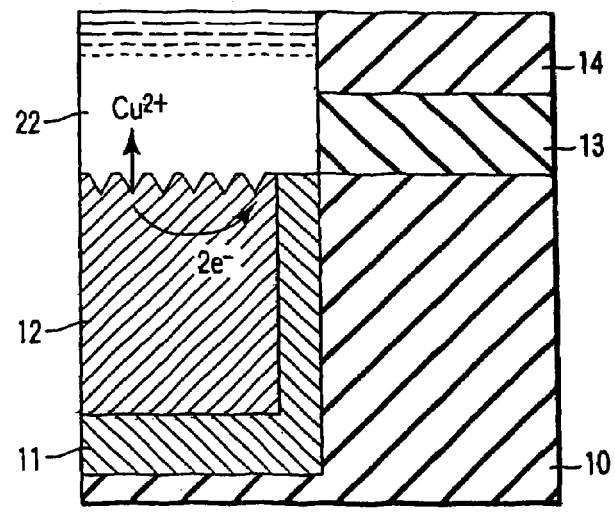
Figure 13C:
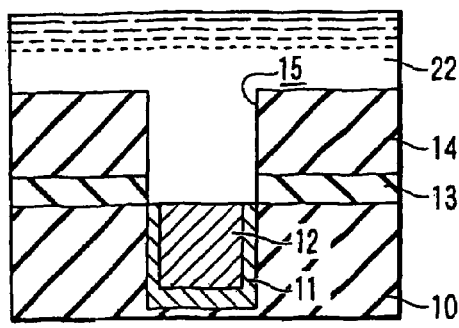

FIG. 10 shows the potential difference between Al and Cu obtained from the measured result of surface potential of Al and Cu in solution. FIG. 11 shows the potential difference between Al and Ti obtained from the measured result of surface potential of Al and Ti in solution. FIG. 12 shows the potential difference between Al and W obtained from the measured result of natural potential of Al and W in solution.

FIGS. 10 to 12 show the measured results when using pure water, a solution dissolving oxygen gas in pure water, and a mixed solution of cathode water and a solution dissolving oxygen gas in pure water (hydrogen-oxygen-dissolved solution), in addition to cathode water. Anode water is used as the solution dissolving oxygen gas in pure water. In this case, the above anode water is the liquid obtained on the anode side when electrolyzing water. When electrolyzing water, the following chemical reaction take place on the cathode side.

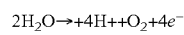

The anode water contains oxygen gas. In the embodiment, degassed pure water is electrolyzed so that anode water can be generated.

As seen from the above FIGS. 10 to 12, the potential difference in the cathode water dissolving hydrogen gas becomes smaller than that in degassed pure water. In addition, the solution dissolving oxygen and hydrogen gases are used, and thereby, the potential difference becomes smaller. Therefore, the cathode water and the anode water may be simultaneously supplied as the rinse liquid.

Accordingly, the cathode water is used as the rinse liquid, and thereby, each potential difference between Al—Cu, Al—Ti and Al—W decreases so that corrosion can be suppressed. In addition, even if the cathode water and the anode water are simultaneously supplied, each potential difference between Al—Cu, Al—Ti and Al—W decreases so that corrosion can be suppressed.

The present invention is not limited to the above third embodiment. For instance, in the above embodiment, TiN is used as the barrier metal; in this case, Ti or lamination structure of TiN and Ti may be used as a barrier metal.

Furthermore, in the above embodiment, cathode water is used; in this case, the rinse liquid is not limited to cathode water, and any other solution may be of course used so long as it is dissolved hydrogen gas. Likewise, the rinse liquid is not limited to anode water, and any other solution may be of course used so long as it is dissolved oxygen gas. In addition, etching solution dissolving hydrogen gas (and oxygen gas) may be supplied in process showing FIG. 9E.

The solution dissolved hydrogen gas may be generated in a manner of passing pure water through a gas dissolving filter introducing hydrogen gas. The solution dissolved hydrogen and oxygen gas may be generated in a manner of passing pure water through a gas dissolving filter introducing hydrogen and oxygen gas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising: forming a copper wiring material on a first interlayer insulating film formed above a semiconductor substrate and having a wiring trench on its surface via a barrier metal; carrying out chemical mechanical polishing with respect to the copper wiring material and the barrier metal so as to form a structure in which the copper wiring material is buried in the wiring trench via the barrier metal and the copper wiring material and the barrier metal are exposed on a surface of the structure; supplying cleaning liquid comprising a hydrogen-dissolved solution into which hydrogen gas is dissolved to the surface of the structure by a wet process; and oxidizing a surface of the copper wiring to form a copper oxide layer after carrying out the chemical mechanical polishing with the copper wiring material and the barrier metal.

2. The method according to claim 1, wherein hydrogen concentration of the hydrogen-dissolved solution is 0.1 ppm or more.

3. The method according to claim 1, wherein the copper oxide layer is formed during rinsing process.

4. The method according to claim 1, wherein the copper oxide layer is formed after the cleaning liquid is supplied to the structure.

5. The method according to claim 1, wherein the thickness of the copper oxide layer is substantially uniform.

6. The method according to claim 1, wherein the barrier metal includes Ta.

7. The method according to claim 1, wherein the barrier metal includes Ti.

8. The method according to claim 1, wherein the cleaning liquid is supplied to remove a copper reactive layer on the copper wiring material.

9. The method according to claim 1, wherein the hydrogen gas in the cleaning liquid is dissolved in pure water.

10. A method of manufacturing a semiconductor device, comprising: forming a copper wiring material on a first interlayer insulating film formed above a semiconductor substrate and having a wiring trench on its surface via a barrier metal; carrying out chemical mechanical polishing with respect to the copper wiring material and the barrier metal so as to form a structure in which the copper wiring material is buried in the wiring trench via the barrier metal and the copper wiring material and the barrier metal are exposed on a surface of the structure; forming a second interlayer insulating film on the first interlayer insulating film and the surface of the structure after carrying out the chemical mechanical polishing with the copper wiring material and the barrier metal; forming an opening in the second interlayer insulating film by etching the second interlayer insulating film to expose the surface of the structure; supplying cleaning liquid comprising a hydrogen-dissolved solution into which hydrogen gas is dissolved to the surface of the structure exposed in the opening by a wet process; and oxidizing the surface of the structure exposed in the opening to form a copper oxide layer.

11. The method according to claim 10, further comprising forming a Soc layer between the first interlayer insulating film and the second interlayer insulating film after carrying out the chemical mechanical polishing with respect to the copper wiring material and the barrier metal.

12. The method according to claim 11, wherein the opening is formed in the second interlayer insulating film and the SOC layer by etching the second interlayer insulating film and the SOC layer to expose the surface of the structure.

13. The method according to claim 10, wherein the cleaning liquid further comprises a diluted hydrofluoric acid.

14. The method according to claim 10, wherein the copper oxide layer is formed during a rinsing process.

15. The method according to claim 10, wherein the copper oxide layer is formed after the cleaning liquid is supplied to the structure.

16. The method according to claim 10, wherein the thickness of the copper oxide layer is substantially uniform.

17. The method according to claim 10, wherein the barrier metal includes Ta.

18. The method according to claim 10, wherein the barrier metal includes Ti.

19. The method according to claim 10, wherein the copper oxide layer is formed by supplying a hydrogen-oxygen-dissolved solution to the structure.

20. The method according to claim 10, wherein the cleaning liquid is supplied to remove a copper reactive layer on the copper wiring material.

* * * * *

UNITED STATES PATENT AND TRADEMARK OFFICE
CERTIFICATE OF CORRECTION

| | | |
|---|---|---|
| PATENT NO. | : 7,727,891 B2 | Page 1 of 1 |
| APPLICATION NO. | : 11/074774 | |
| DATED | : June 1, 2010 | |
| INVENTOR(S) | : Matsui et al. | |

It is certified that error appears in the above-identified patent and that said Letters Patent is hereby corrected as shown below:

Claim 11, column 10, line 33, change "a Soc" to --an SOC--.

Signed and Sealed this

Seventeenth Day of August, 2010

David J. Kappos
*Director of the United States Patent and Trademark Office*